United States Patent [19]

Schneider

[11] Patent Number: 4,873,443
[45] Date of Patent: Oct. 10, 1989

[54] MAGNETIC SUPERCONDUCTING DETECTOR

[75] Inventor: Richard T. Schneider, Alachua, Fla.

[73] Assignee: Progress Technology Corporation, St. Petersburg, Fla.

[21] Appl. No.: 137,136

[22] Filed: Dec. 23, 1987

[51] Int. Cl.[4] .................. H01L 39/00; H01L 27/18
[52] U.S. Cl. ........................ 250/336.2; 250/338.1; 505/849
[58] Field of Search ............ 250/336.2, 338.4, 338.1, 250/336.1, 370.15; 505/1, 848, 849, 875

[56] References Cited

U.S. PATENT DOCUMENTS

| 2,189,122 | 2/1940 | Andrews | 250/336.2 |
| 3,193,685 | 7/1965 | Burstein | 250/211 J |
| 4,126,783 | 11/1978 | Lanza et al. | 250/336.2 |
| 4,149,075 | 4/1979 | Drukier et al. | 250/336.2 |

FOREIGN PATENT DOCUMENTS 0102398  3/1984  European Pat. Off. .......... 250/336.2

OTHER PUBLICATIONS

W. Seidel, L. Oberauer and F. V. Feilitzsch, "Feasibility of a detector for nuclear radiation based on superconducting grains" Review of Scientific Instruments, vol. 58, No. 8, (Aug. 1987) pp. 1471-1476.

Anil Khurana, "Superconductivity Seen above the Boiling Point of Nitrogen" (Apr. 1987), Physics Today, pp. 17-23.

D. R. Clarke, "The Development of High-Tc Ceramic Superconductors: AN Introduction" 1987, Advanced Ceramic Materials, vol. 2, No. 3B, pp. 273-292, 363, 435, 489, 501 and 503.

Primary Examiner—Constantine Hannaher
Attorney, Agent, or Firm—Cushman, Darby & Cushman

[57] ABSTRACT

A photon detector which uses a superconducting material to detect photons of a specific frequency. The superconducting material is kept in its superconducting state so that resistance in the material does not appear, but incident photons produce a detectable magnetic field within the superconducting material. Sensing this magnetic field in the superconducting in its superconducting state allows for the detection of photons.

24 Claims, 1 Drawing Sheet

U.S. Patent
Oct. 10, 1989
4,873,443
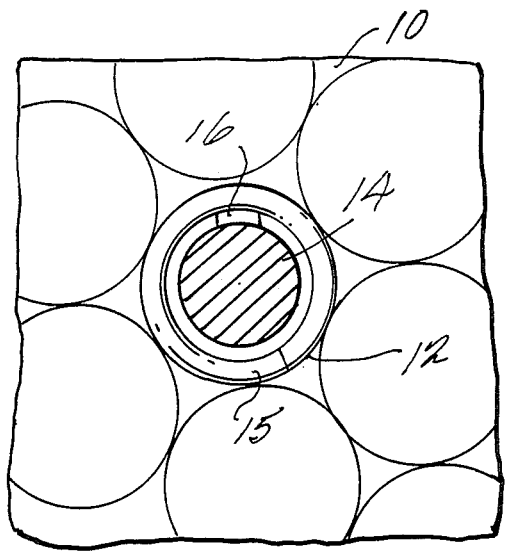
FIG. 1
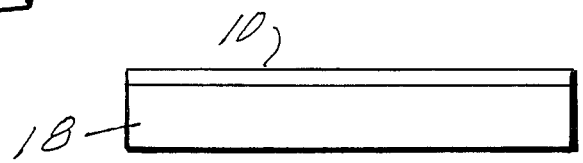
FIG. 2
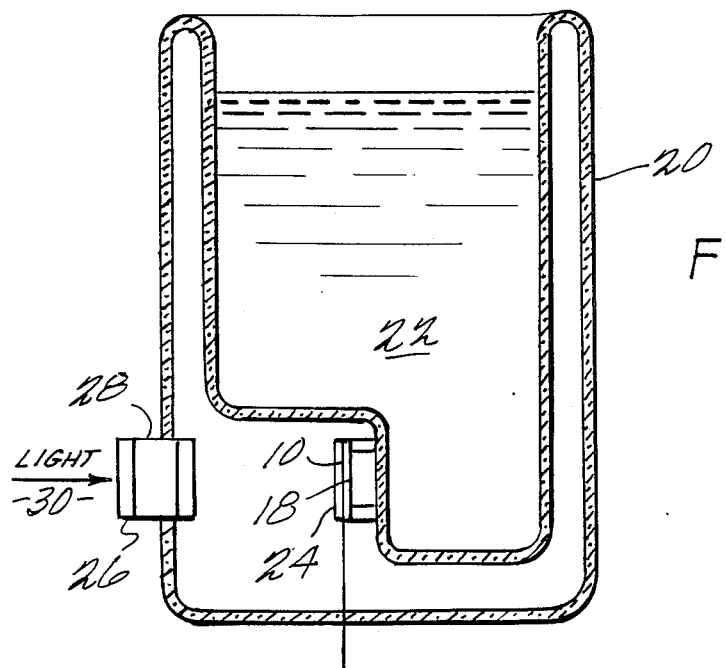
FIG. 3
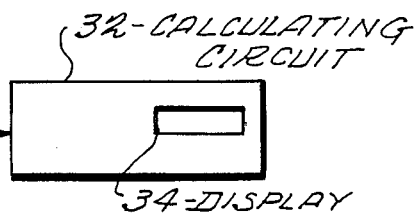

MAGNETIC SUPERCONDUCTING DETECTOR

BACKGROUND OF THE INVENTION

1. Field of the Invention

This invention relates to a photon detector with a superconducting material t detect photons of specific frequencies.

2. Background and Prior Art

Many types of photon detectors are known. Examples which use the photoelectric effect are photomultiplier tubes and microchannel plates. These detectors can detect light having a specific frequency. For example, detectors using PbS, PbSe, InAS, and InSb can be used to detect light in the infrared region of the spectrum.

These detectors work only when the wavelength of the photon to be detected is equal or close to the work function or gap energy of the material being used to detect the electric field component of the electromagnetic light.

Although the above mentioned detectors are accurate, they are limited in application because a material with a band gap or work function which is essentially equal to the photon energy is needed. Furthermore, greater sensitivity in detection of light, especially individual photons, is necessary in many situations.

SUMMARY OF THE INVENTION

In the present invention a superconducting material is used as a detector of photons. The superconducting material is kept in its superconducting state so that no resistance is present. The induced current produced by the magnetic field component of photons which strike the superconducting material is measured. Since no resistance is present, the magnetic field component of the photons is measurable and used to determine whether photons have struck the superconducting material.

The photons are detected by the detector by sensing the induced current. A sensing coil having a diameter which is substantially equal to the wavelength of the photons to be detected can be used for example to measure the induced currents. By varying the diameter of the sensing coil, photons of various wavelengths can be measured.

This invention can be used in many different ways. For example, it can be used to detect the presence of exhaust in aircraft or rocket engines, the presence of various laser frequencies, the presence of skin cancer when irradiating a patient or as a discriminator for FM modulation. These are only examples of applications of the present invention.

BRIEF DESCRIPTION OF THE DRAWINGS

These and other advantages of the present invention may be appreciated from studying the following detailed description of the preferred embodiment together with the drawings in which:

FIG. 1 is a enlarged top view of a superconducting detector of the present invention;

FIG. 2 illustrates a side elevational view of the superconducting detector mounted on a substrate; and FIG. 3 is a front view of the magnetic superconducting detector.

DETAILED DESCRIPTION OF THE PREFERRED EMBODIMENT

Superconducting detector chip 10 is partially illustrated in FIG. 1. Detector 10 is composed of a plurality of grains 12 each of which is made of superconducting material 15. Grains 12 are of a size which is slightly greater than the diameter of sensing coil 15. Sensing coil 15 has a diameter which is substantially equal to the wavelength of the photons to be detected. Because detection of various wavelengths is possible, different grain sizes will also exist. For example, grain sizes of 4 $\mu$m–5 $\mu$m would be necessary to detect exhaust from rocket and aircraft engines. Therefore, by making individual grains 12 only slightly larger than sensing coil 15 which will be placed on each grain 12, detector chip 10 will have the greatest number of detectors 12 possible. The result is a magnetic superconducting detector which is very sensitive. If the diameter of grains 12 were larger, a smaller number of the sensing coils 15 would have to be displaced over the same area of detector chip 10, thereby making a less sensitive detector.

Sensing coil 15 includes rectifier 16 which is necessary for detecting short wavelengths because the induced currents in sensing coil 15 cannot be followed if they are caused by electromagnetic radiation having a wavelength which is less than 2000 $\mu$m. Rectifying the induced currents with rectifier 16 enables the detection of induced currents caused by electromagnetic radiation of a very short wavelength.

FIG. 2 illustrates an elevational view of a detector chip 10 which is mounted on a substrate 18. Substrate 18 can be composed of sapphire or quartz. Detector chip 10 is made of superconducting material 14. Superconducting material 14 can be $YBa_2Cu_3O_7$, for example. Other superconducting materials such as $La_2CuO_4$, $Sr_2CuO_4$, $Nb_3Ge$, among others can be used. The April 1987 printing of *Physics Today* shows on page 23 a chart of other illustrative superconducting materials which can be used.

Detector chip 10 can be made as follows. Superconducting material 14 has its individual grains reduced to a proper size by pulverization. Grain sizes of less than 1,000 Angstroms are necessary for an efficient detector chip 10. Each individual grain is an individual detector 12. After superconducting material 14 has been pulverized, material 14 is baked in an oven for two hours at 1,000 K. After firing, material 14 should be placed on a substrate 18 as shown FIG. 2, such as sapphire or quartz, and polished to thicknesses between 100 and 1,000 Angstroms.

After polishing, typical VLSI techniques can be used to mount sensing coils 15 along with rectifiers 16 on individual detectors 12. Once this is done, detector 10 is ready for use.

FIG. 3 illustrates that housing 20 holds most of the structure of the magnetic superconductor detector. Chamber 22 is filled with liquid nitrogen to keep detector chip 10, with its individual detectors 12, at a superconducting temperature. Detector chip 10 is then mounted on housing 20. Detector chip 10 is mounted so that window 26 will allow photons of light 30 to pass through window 26 and strike detector chip 10. Window 26 is made of two panes which have a vacuum 2B between the panes. This prevents condensation from developing on window 26 due to the low temperature.

When photons from incident light 30 strike individual detectors 12, sensing coils 15 will sense the induced current. This induced current is sensed using the principles of the Meissner effect, also known as Lenz's Law. These measured induced currents are then sent to calculating circuit 32 where the multitude of photons detected can be calculated and the result of the detection displayed on display 34.

While the invention has been described in connection with what is presently the most practical and preferred embodiments, it is to be understood that the invention is not limited to the disclosed embodiment but is intended to cover various modifications and equivalent arrangements. Therefore, persons of ordinary skill in this field are to understand that all such equivalent structures are to be included within the scope of the following claims.

What is claimed is:

1. A photon detector comprising:
   a superconducting material;
   means for maintaining said superconducting material in a superconducting state; and
   means for sensing induced currents formed in said material when said photons strike said material.

2. A detector according to claim 1 wherein said sensing means includes a sensing coil.

3. A detector according to claim 2 wherein said sensing coil has a diameter which is substantially equal to the wavelength of said photon to be detected.

4. A detector according to claim 2 wherein said sensing coil has a diameter of 4 $\mu$m–5 $\mu$m.

5. A detector according to claim 2 wherein said sensing coil has a diameter of 10 $\mu$m–11 $\mu$m.

6. A detector according to claim 1 wherein said sensing means includes a rectifier.

7. A detector according to claim 6 wherein said pluralities of sensing coils includes sensing coils having different diameters.

8. A detector according to claim 7 wherein said sensing means includes a rectifier.

9. A method of detecting photons comprising the steps of:
   keeping a superconducting material in a superconducting state;
   orienting said material so that incident photons can strike said material to cause an induced current in said material; and
   sensing said induced current.

10. A method according to claim 9 wherein said sensing step includes sensing induced current in at least one coil.

11. A method according to claim 10 wherein the diameter of said coil is substantially equal to the wavelength of said incident photons.

12. A method according to claim 9 including the further step rectifying said induced current before sensing.

13. A method according to claim 9 wherein said step of keeping includes cooling said material with liquid nitrogen.

14. A photon detector comprising:
    a housing;
    a superconducting material disposed in said housing;
    means for keeping said superconducting material in a superconducting state disposed in said housing;
    means for orienting said superconducting material so that photons fall on said material; and
    means for sensing the magnetic field component of photons which strike said material.

15. A detector according to claim 14 further including computational circuitry for calculating and displaying the quantity of photons which have struck said detector.

16. A detector according to claim 15 wherein said at least one sensing coil has a diameter substantially equal to the wavelength of the photons to be detected.

17. A detector according to claim 14 wherein said sensing means includes at least one sensing coil attached to said material.

18. A detector according to claim 17 wherein said at least one sensing coil further includes a rectifier.

19. A detector according to claim 14 wherein said means which keep said material in a superconducting state is a chamber filled with liquid nitrogen.

20. A photon detector chip comprising:
    a substrate;
    a superconducting material mounted on said substrate;
    means for sensing induced currents in said material, said sensing means attached to said material.

21. A detector chip according to claim 20 wherein said material is polished to a thickness of between 100–1000 Angstroms.

22. A detector chip according to claim 20 wherein the grains of said superconducting material have a size less than 1000 Angstroms.

23. A detector chip according to claim 21 wherein said sensing means includes a plurality of sensing coils.

24. A detector chip according to claim 23 further including a rectifier attached to each of said sensing coils.

* * * * *